(12) United States Patent
Okishima et al.

(10) Patent No.: US 12,341,087 B2
(45) Date of Patent: Jun. 24, 2025

(54) SEMICONDUCTOR PACKAGE AND SEMICONDUCTOR DEVICE

(71) Applicant: KIOXIA CORPORATION, Tokyo (JP)

(72) Inventors: Takuya Okishima, Yokohama Kanagawa (JP); Keiichi Akama, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 546 days.

(21) Appl. No.: 17/411,950

(22) Filed: Aug. 25, 2021

(65) Prior Publication Data
US 2022/0302001 A1  Sep. 22, 2022

(30) Foreign Application Priority Data
Mar. 16, 2021  (JP) .................................. 2021-042776

(51) Int. Cl.
*H01L 23/498* (2006.01)
*H01L 23/00* (2006.01)

(52) U.S. Cl.
CPC .. *H01L 23/49816* (2013.01); *H01L 23/49822* (2013.01); *H01L 23/49827* (2013.01); *H01L 24/48* (2013.01); *H01L 2224/48227* (2013.01)

(58) Field of Classification Search
CPC ......... H01L 23/49816; H01L 23/49822; H01L 23/49827; H01L 24/48; H01L 2224/48227
See application file for complete search history.

(56) References Cited

U.S. PATENT DOCUMENTS

| | | | | |
|---|---|---|---|---|
| 5,410,184 A | * | 4/1995 | Melton | .................... H01L 24/13 257/772 |
| 6,278,264 B1 | * | 8/2001 | Burstein | ........... H01L 23/49844 257/700 |
| 6,365,978 B1 | * | 4/2002 | Ibnabdeljalil | ..... H01L 23/49816 257/737 |
| 8,012,797 B2 | | 9/2011 | Shen et al. | |
| 8,896,133 B2 | | 11/2014 | Cho et al. | |
| 2003/0020145 A1 | * | 1/2003 | Umezaki | .......... H01L 23/49816 257/657 |
| 2009/0137717 A1 | * | 5/2009 | Ikezawa | ................ H01L 23/295 524/436 |
| 2010/0171207 A1 | | 7/2010 | Shen et al. | |

(Continued)

FOREIGN PATENT DOCUMENTS

JP             2007242783 A         9/2007

*Primary Examiner* — Benjamin Tzu-Hung Liu
(74) *Attorney, Agent, or Firm* — Kim & Stewart LLP

(57) ABSTRACT

A packaged semiconductor device includes a wiring substrate with a bonding pad on a first surface, a wiring layer, a first conductive plug extending through the wiring substrate from the wiring layer to the first surface, a second conductive plug extending through the wiring substrate from the wiring layer to a second surface, and a third conductive plug extending through the wiring substrate from the wiring layer to the second surface. A semiconductor chip is mounted on the first surface and has a pad terminal electrically connected to the bonding pad. A first solder ball is on the second surface of the wiring substrate and electrically connected to the second conductive plug. A second solder ball is on the second surface of the wiring substrate and electrically connected to the third conductive plug.

22 Claims, 3 Drawing Sheets

(56) References Cited

U.S. PATENT DOCUMENTS

| | | | |
|---|---|---|---|
| 2011/0248398 A1* | 10/2011 | Parvarandeh | H01L 24/11 |
| | | | 257/737 |
| 2017/0162555 A1* | 6/2017 | Jo | H01L 24/81 |
| 2021/0035939 A1* | 2/2021 | Su | H01L 24/20 |
| 2022/0028815 A1* | 1/2022 | Takaku | H01L 24/73 |

* cited by examiner

SEMICONDUCTOR PACKAGE AND SEMICONDUCTOR DEVICE

CROSS-REFERENCE TO RELATED APPLICATION(S)

This application is based upon and claims the benefit of priority from Japanese Patent Application No. 2021-042776, filed Mar. 16, 2021, the entire contents of which are incorporated herein by reference.

FIELD

Embodiments described herein relate generally to a semiconductor package and a semiconductor device.

BACKGROUND

Semiconductor devices utilizing a ball grid array (BGA) to electrically connect a packaged semiconductor chip to a printed circuit board are known.

DETAILED DESCRIPTION

Embodiments provide a packaged semiconductor chip and a semiconductor device which can improve the reliability of operation and achieve a longer life.

In general, according to one embodiment, a semiconductor package includes a wiring substrate with a first surface and a second surface opposite the first surface. A bonding pad is on the first surface of the wiring substrate. A wiring layer is in the wiring substrate between the first surface and the second surface. A first conductive plug extends through the wiring substrate from the wiring layer to the first surface. The first conductive plug is connected to the bonding pad. A second conductive plug extends through the wiring substrate from the wiring layer to the second surface. The second conductive plug is also electrically connected to the bonding pad. A third conductive plug extends through the wiring substrate from the wiring layer to the second surface. The third conductive plug is also electrically connected to the bonding pad. A semiconductor chip is mounted on the first surface and has a pad terminal that is electrically connected to the bonding pad. A first solder ball is on the second surface of the wiring substrate and electrically connected to the second conductive plug. A second solder ball is on the second surface of the wiring substrate and electrically connected to the third conductive plug.

Hereinafter, certain example embodiments will be described with reference to the drawings.

First Embodiment

Figure 1:
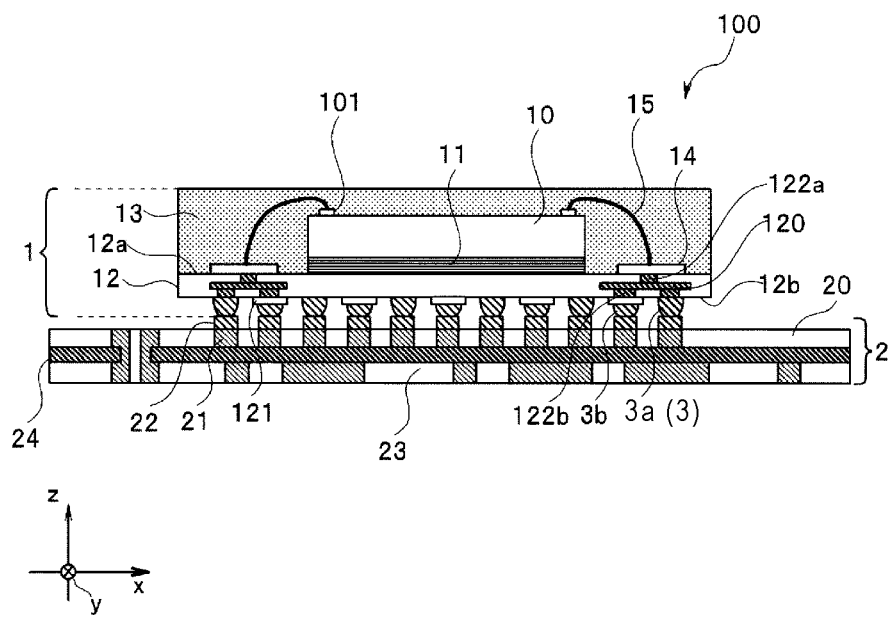
FIG. 1 is a cross-sectional view of a semiconductor device according to a first embodiment.
Figure 2A:
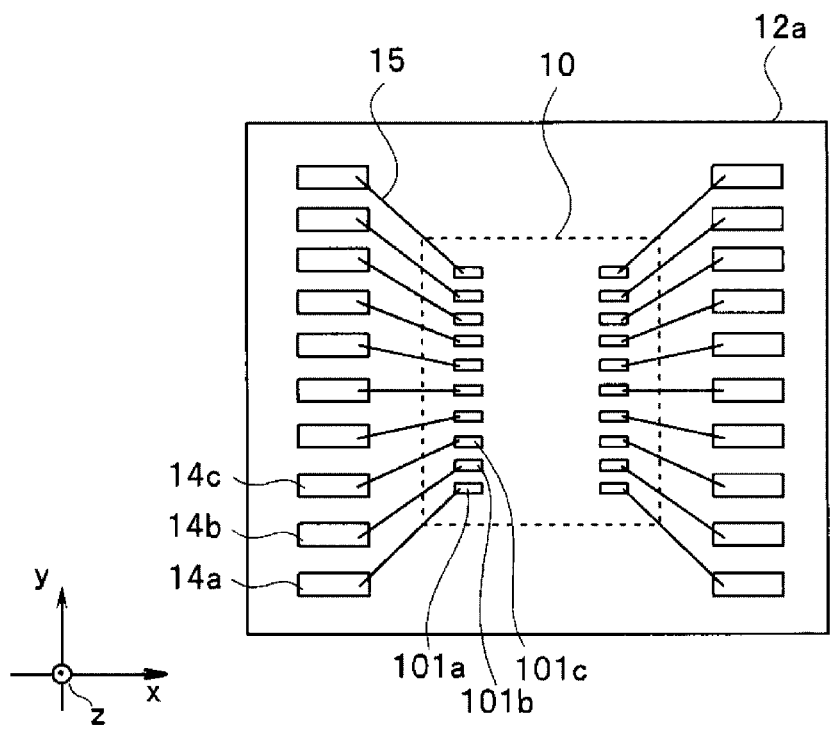
FIG. 2A is a top view of a semiconductor package.
Figure 2B:
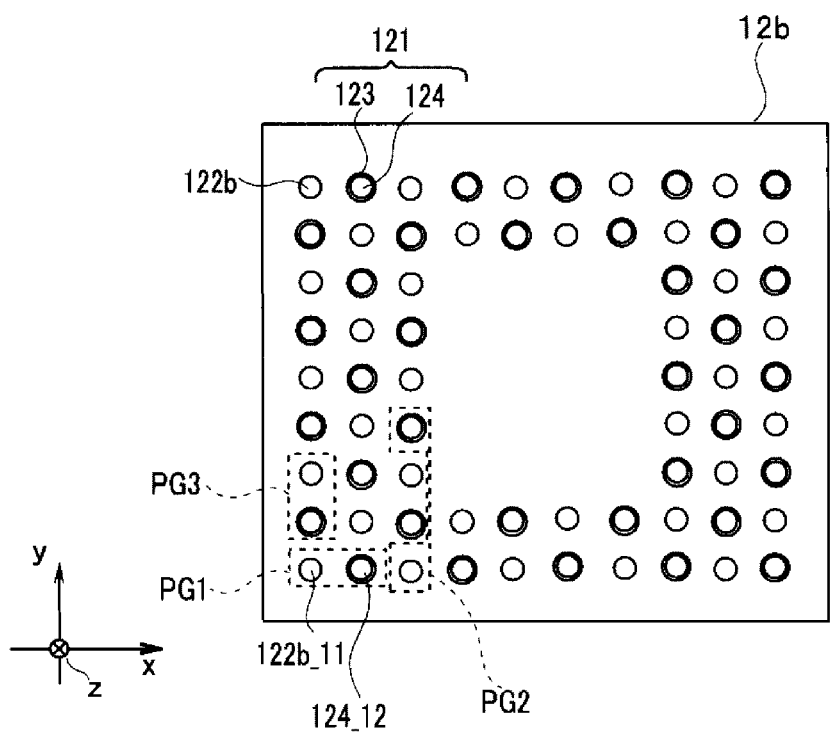
FIG. 2B is a bottom view of a semiconductor package.

FIG. 1 is a cross-sectional view of a semiconductor device 100 according to a first embodiment. FIG. 2A is a top view of a semiconductor package 1. FIG. 2B is a bottom view of the semiconductor package 1. In the following description, a plane parallel to the front surface of a wiring substrate 12 in the semiconductor device 100 is assumed to be an xy plane and a direction orthogonal to the xy plane is assumed to be a z direction. In the following description, references may be made to an up-and-down relationship, which assumes that the side of the wiring substrate 12 where a first surface 12a is located is an upper side and the side of the wiring substrate 12 where a second surface 12b is located is a lower side. Such directional references are for the purposes of explanation relative positioning of components and aspects within the semiconductor device 100 and are not necessarily corresponding to a gravitational orientation or the like.

In FIG. 1, the structure of an xz cross section obtained by cutting the semiconductor device 100 along an xz plane is shown. The semiconductor device 100 includes the semiconductor package 1 and a printed wiring board 2. The semiconductor package 1 includes external terminals 3, a semiconductor chip 10, a film adhesive 11, a wiring substrate 12, encapsulating resin 13, bonding pads 14, conductive components 15, and a convex component 121.

The wiring substrate 12 includes a wiring layer 120, a metal plug 122a, and a metal plug 122b. The wiring substrate 12 is, for example, an insulating resin wiring substrate or a ceramic wiring substrate, which has the multilayer wiring layer 120 on its front surface thereof or inside. In this example, a printed wiring substrate comprising glass epoxy resin is used as a wiring substrate 12. In FIG. 1, a part of the wiring layer 120 is shown. In general, the front surface of the wiring substrate 12 is covered with a solder resist to protect such wiring as included in wiring layer 120. The wiring substrate 12 has a first surface 12a and a second surface 12b.

A bonding pad 14 is formed on the first surface 12a of the wiring substrate 12. A via hole passing through the solder resist on the first surface 12a to the wiring layer 120 is provided for making electrical connections. The via hole is conductive metal and the metal plug 122a is formed therein. The bonding pad 14 and the wiring layer 120 are electrically connected by metal plug 122a.

A semiconductor chip 10 is provided on the first surface 12a of the wiring substrate 12. Non-limiting examples of a semiconductor chip 10 include a NAND flash memory chip. In general, any semiconductor chip type (or combinations of types), such as a memory component, such as dynamic random access memory (DRAM) chip, an arithmetic component, such as a microprocessor chip, or a signal processing component may be used. A film adhesive 11 is on the entire rear surface of the semiconductor chip 10. In this context, the rear surface is the side of semiconductor chip 10 facing the wiring substrate 12.

The film adhesive 11 can be a thermoset resin. For example, film adhesive 11 can be an epoxy-based resin, a polyimide-based resin, an acrylic-based resin, or a combination of these resins. A die attach film (DAF), Film on Wire (FOW) in which a conductive wire may be embedded, or the like can be used as film adhesive 11. The semiconductor chip 10 is firmly fixed to the wiring substrate 12 via the film adhesive 11.

As shown in FIG. 2A, a pad 101 is formed on the front surface of the semiconductor chip 10. In this context, the front surface is the side of semiconductor chip 10 facing away from the wiring substrate 12. The pad 101 and the bonding pad 14 (on the wiring substrate 12) are electrically connected using a conductive component 15, which may be a conductive wire such as a bonding wiring. Each pad 101 is connected to a bonding pad 14 on a one-to-one basis. For example, as depicted in FIG. 2A, a pad 101a is connected to a bonding pad 14a, a pad 101b is connected to a bonding pad 14b, and a pad 101c is connected to a bonding pad 14c. The semiconductor chip 10 is encapsulated in encapsulating resin 13 provided on the upper surface side of the wiring substrate 12.

External terminals 3 for a BGA-type package is provided on the second surface 12b of the wiring substrate 12. Each external terminal 3 in this example is a projecting (protruding) terminal such as a solder ball. In the following description, the external terminals 3 are referred to as solder balls 3. A solder ball 3 can be electrically connected to the wiring layer 120 of the wiring substrate 12. Specifically, a via hole in the solder resist covering the second surface 12b of the wiring substrate 12 to the wiring layer 120 is provided. The via hole is filled with conductive metal and the metal plug 122b is formed. A solder ball 3 and the wiring layer 120 can be electrically connected by metal plug 122b. The metal plug 122b may also be referred to as a land 122b in some instances. In the semiconductor device 100 of the first embodiment, two types of solder balls 3 (solder balls 3a and solder balls 3b) are used. In the description of the first embodiment, it is assumed that reference to a "solder ball 3" refers to both the solder balls 3a and the solder balls 3b.

The printed wiring board 2 (printed circuit board) comprises a mounting board 23, which is made of an insulating material such as glass epoxy resin, and a wiring layer 24 formed on the upper surface of the mounting board 23. Various circuit pattern structures and connections may be formed in the wiring layer 24. The wiring layer 24 is formed of a conductive metal such as gold (Au), silver (Ag), copper (Cu), aluminum (Al), nickel (Ni), palladium (Pd), and tungsten (W). A circuit protective layer 20 comprising a solder resist can be formed on the front surface of the wiring layer 24. In the circuit protective layer 20, a via hole passing through the circuit protective layer 20 permits electrically connections between the wiring layer 24 and the solder balls 3, and a mounting board terminal 21 formed of conductive metal can be formed inside the via hole. Solder paste 22 is applied to (e.g., printed on) the upper surface side of the mounting board terminal 21 to connect a solder ball 3 to a mounting board terminal 21.

The solder ball 3b and the solder ball 3a have the same configuration as one another excepting for length in the z direction. In the following description, the length of a solder ball 3 in the z direction is sometimes referred to as a height. The composition of the solder ball 3b is identical to the composition of the solder ball 3a. That is, the solder balls 3a and 3b are the same materials. For example, the solder balls 3a and 3b are made of a Sn—Ag—Cu-based (SAC-based) alloy. The alloy ingredients are, for example, Sn: 96.5 wt %; Ag: 3.0 wt %, Cu: 0.5 wt %. Such composition corresponds to the composition recommended by the Japan Electronic Industry Development Association (JEIDA).

The length of the solder ball 3b in the z direction is shorter than the length of the solder ball 3a in the z direction. The solder ball 3b is connected to the metal plug 122b of the wiring substrate 12 via a convex component 121. The convex component 121 has the shape of a cylinder, for example. The convex component 121 includes a base component 123 and a metal plug 124 (see FIG. 2B). The base component 123 is a doughnut-shaped (annular) insulating structure formed of insulating resin material. The metal plug 124 is conductive metal which fills the region inside of the base component 123. The solder ball 3b is connected to the metal plug 122b of the wiring substrate 12 via the metal plug 124 interposed therebetween. The length of the convex component 121 in the z direction is set such that the value of the sum of the length of the convex component 121 in the z direction and the length of the solder ball 3b in the z direction will be almost the same as the length of the solder ball 3a in the z direction. The convex component 121 may be referred to as a spacer element 121 or a spacer plug 121 in some contexts.

As shown in FIG. 2B, a plurality of plug groups (e.g., PG1, PG2, PG3) are on the second surface 12b of the wiring substrate 12. Each plug group includes one or more of the metal plugs 122b and one or more of the metal plugs 124. The solder balls 3a are connected to the metal plugs 122b. The solder balls 3b are connected to the metal plugs 124. Each plug group is electrically connected to one bonding pad 14. For example, the bonding pad 14a shown in FIG. 2A is electrically connected to a plug group PG1 shown in FIG. 2B. That is, a signal which is output from a pad 101 via a bonding pad 14 is transferred to at least one metal plug 122b and at least one metal plug 124 of a corresponding plug group for the particular bonding pad 14. For example, a signal which is output from the pad 101a via the bonding pad 14a is transferred to a metal plug 122b_11 and a metal plug 124_12 which are provided in the plug group PG1. That is, each pad 101 is electrically connected to at least one solder ball 3a and at least one solder ball 3b.

A semiconductor device 100 using a BGA-type packaging is generally more suitable for making connection terminals denser and miniaturizing the semiconductor device 100 as compared to a quad flat package (QFP) in which the semiconductor package 1 and the printed wiring board 2 are connected via a lead frame. Therefore, the semiconductor device 100 using a BGA is more often used in mobile digital equipment. Mobile digital equipment is required to have resistance to thermal cycle fatigue caused by turning of the electronic equipment ON-OFF (hereinafter referred to as resistance to thermal fatigue), as well as resistance to being dropped during use (hereinafter referred to as resistance to drop impacts).

In general, the greater the height (z-direction length) of the solder balls 3, the greater a spring effect provided by the solder balls 3, which permits the solder balls 3 themselves to absorb induced stresses and thus makes resistance to thermal fatigue higher. On the other hand, the greater the height of the solder balls 3, the more easily stress concentrates at a joint between the solder ball 3 and the metal plug 122b, which reduces resistance to drop impact. That is, the greater the height of a solder ball 3, the better the resistance to thermal fatigue but the lower the resistance to drop impacts. Conversely, the less the height of the solder ball 3, the better the resistance to drop impacts but the lower the resistance to thermal fatigue. Resistance to thermal fatigue can be measured by temperature cycle testing, for example. Resistance to drop impacts can be measured by impact testing, for example.

The semiconductor device 100 of the first embodiment includes two types of solder balls 3a and 3b which are different in height from each other, and each bonding pad 14 is connected to one or more solder balls 3a and one or more solder balls 3b. That is, each bonding pad 14 is connected to at least one solder ball 3a providing higher resistance to thermal fatigue and at least one solder ball 3b providing higher resistance to drop impacts. Additionally, this configuration makes it possible to transmit and receive a signal to and from the printed wiring board 2 via a solder ball 3a when a solder ball 3b has been damaged by thermal fatigue and to transmit and receive a signal to and from the printed wiring board 2 via a solder ball 3b when a solder ball 3a has been damaged by drop impact. This improves the reliability of operation and makes it possible to achieve a longer device lifetime.

The shape of the convex component 121 is not limited to a columnar shape. The convex component 121 may have any other shape as long as the convex component 121 can stably connect a solder ball 3b to a metal plug 122b of the wiring substrate 12. Moreover, the composition of the solder balls 3a and 3b is not limited to the materials mentioned above. For example, another alloy such as a Sn—Cu-based alloy or a Sn—Ag-based alloy may be used. Furthermore, the material composition may have a composition ratio other than that mentioned above, such as Sn:95.5 wt %, Ag:4.0 wt %, Cu:0.5 wt %, such as recommended by the National Electronics Manufacturing Initiative (NEMI).

Second Embodiment

Next, a semiconductor device 100 according to a second embodiment will be described. The semiconductor device 100 of the second embodiment is different from semiconductor device 100 of the first embodiment in the configuration of certain solder balls 3. In the second embodiment, aspects and/or components identical to those of the first embodiment are given the same reference symbol and detailed explanations thereof may be omitted.

Figure 3:
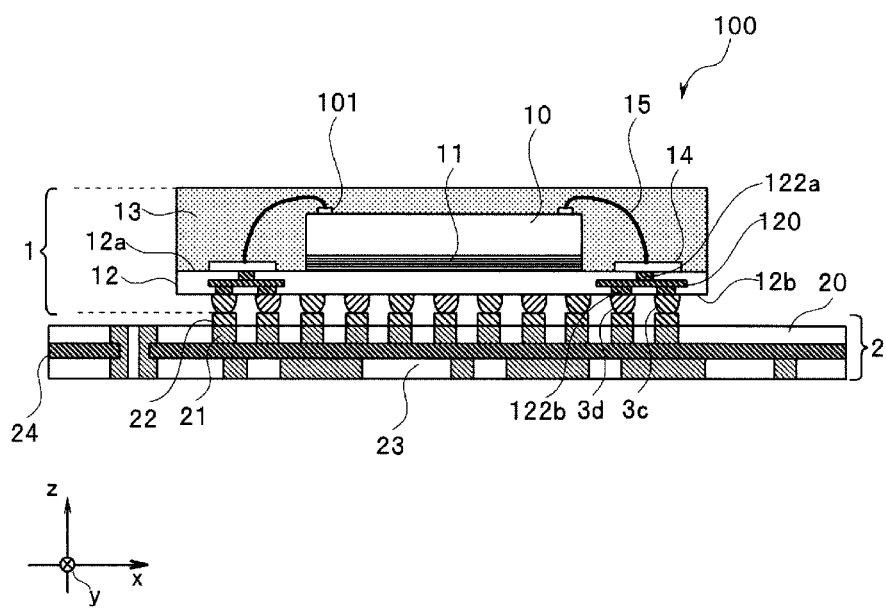
FIG. 3 is a cross-sectional view of a semiconductor device according to a second embodiment.
Figure 4:
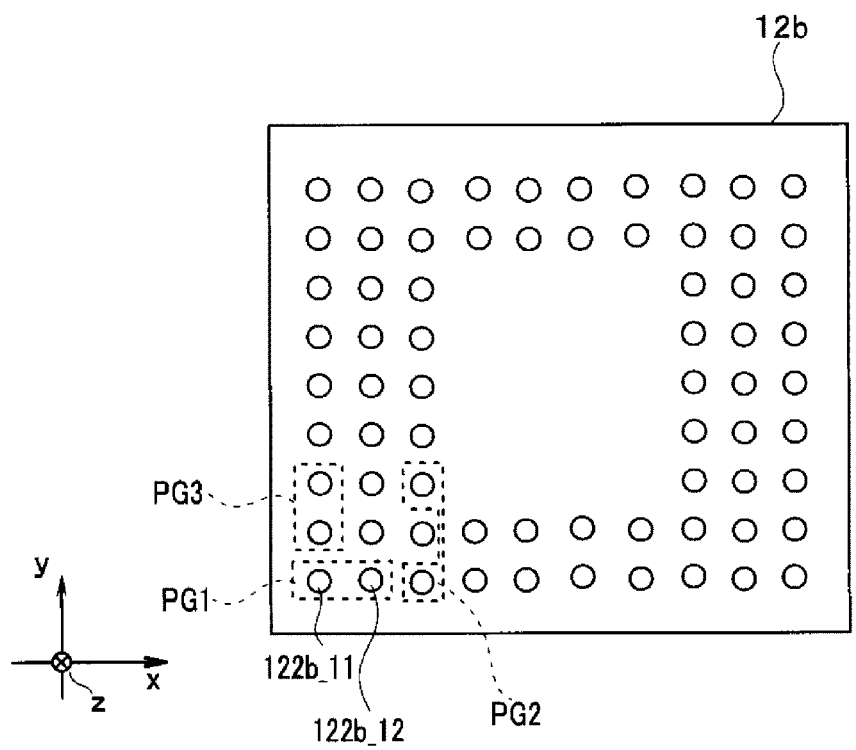
FIG. 4 is a bottom view of a semiconductor package.

FIG. 3 is a cross-sectional view showing the structure of the semiconductor device 100 according to the second embodiment of the present disclosure. FIG. 4 is a bottom view of a semiconductor package 1 shown in FIG. 3. In the semiconductor device 100 of the second embodiment, the semiconductor package 1 and a printed wiring board 2 are connected by two different types of solder balls 3c and 3d. The solder balls 3c and the solder balls 3d have the same size as one another, but the solder balls 3c and the solder balls 3d are different in material composition from each other. For example, the solder balls 3c and 3d are both made of different Sn—Ag—Cu-based (SAC-based) alloys. For example, the alloy ingredients of the solder balls 3c are Ag: 3 wt %, Cu: 0.8 wt %, Bi: 3 wt %, Ni: 0.02 wt %, Sn: (balance). The alloy ingredients of the solder balls 3d are Ag: 1.2 wt %, Cu: 0.5 wt %, Ni: 0.05 wt %, Sn: (balance).

The solder balls 3c have characteristics providing better resistance to thermal fatigue. The alloy ingredients of the solder balls 3c are different from the alloy ingredients of the solder balls 3a and 3b in the first embodiment in that bismuth (Bi) is added and the content of copper (Cu) is increased. By adding Bi, solid-solution strengthening is achieved. By increasing the content of Cu, precipitation strengthening is achieved. That is, with solid-solution strengthening by Bi and precipitation strengthening by Cu, the corresponding solder ball is made harder and resists deformation. This increases resistance to thermal fatigue.

On the other hand, the solder ball 3d has characteristics providing better resistance to drop impacts. The alloy ingredients of the solder ball 3d are different from the alloy ingredients of the solder balls 3a and 3b in the first embodiment in that the silver (Ag) content is reduced. A reduction in the silver content makes the solder ball softer, which increases resistance to drop impact. The specific material compositions of the solder balls 3c and 3d above are merely examples and other material compositions may be adopted.

As shown in FIG. 4, a plurality of plug groups (e.g., PG1, PG2, PG3) are on the second surface 12b of a wiring substrate 12. Each plug group includes a plurality of metal plugs 122b. A solder ball 3c is connected to one or more metal plugs 122b belonging to each plug group. A solder ball 3d is connected to one or more metal plugs 122b belonging to each plug group. For example, metal plugs 122b_11 and 122b_12 belong to a plug group PG1. A solder ball 3c is connected to the metal plug 122b_11 and a solder ball 3d is connected to the metal plug 122b_12. That is, at least one solder ball 3c and at least one solder ball 3d are connected to each plug group.

Each plug group is electrically connected to a corresponding one of the bonding pads 14. A signal which is output from a pad 101 via a bonding pad 14 is thus transferred to a plurality of metal plugs 122b of the plug group which is electrically connected to the bonding pad 14. That is, each pad 101 is electrically connected to one or more solder balls 3c and one or more solder balls 3d.

The semiconductor device 100 of the second embodiment includes two types of solder balls 3c and 3d which are different in composition. As in the case of the first embodiment, the semiconductor device 100 according to the second embodiment can transmit and receive a signal to and from the printed wiring board 2 via the solder ball 3c when the solder ball 3d is damaged by thermal fatigue and can transmit and receive a signal to and from the printed wiring board 2 via the solder ball 3d when the solder ball 3c is damaged by drop impact. This increases the reliability of operation and makes it possible to achieve a longer life.

Third Embodiment

Next, a semiconductor device 100 according to a third embodiment will be described. The semiconductor device 100 of the third embodiment is different from the semiconductor device 100 of the second embodiment in a connection between a mounting board terminal 21 and a solder ball 3. The components and aspects identical to that of the second embodiment is denoted by the same reference symbol and detailed explanations thereof are omitted.

Figure 5:
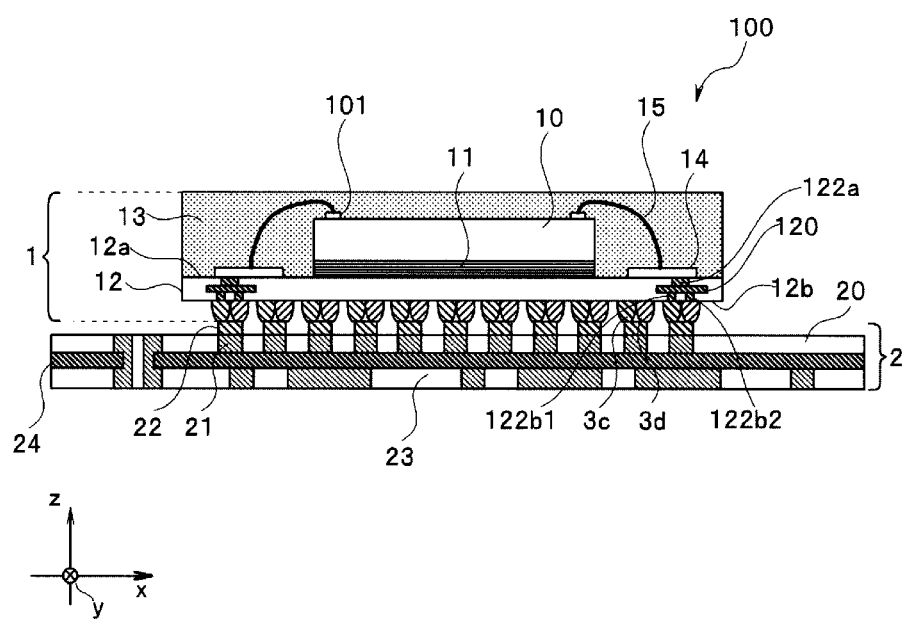
FIG. 5 is a cross-sectional view of a semiconductor device according to a third embodiment.

FIG. 5 is a cross-sectional view showing the structure of the semiconductor device 100 according to the third embodiment. In the semiconductor device 100 of the third embodiment, a semiconductor package 1 and a printed wiring board 2 are connected by two types of solder balls 3 (3c and 3d). The solder ball 3c has characteristics providing higher resistance to thermal fatigue, and the solder ball 3d has characteristics providing higher resistance to drop impact. The material compositions of the solder balls 3c and 3d can be the same as those of the second embodiment, for example.

The solder ball 3c is connected to a metal plug 122b1. The solder ball 3d is connected to a metal plug 122b2. Each bonding pad 14 is connected to two metal plugs 122b1 and 122b2. A signal which is output from a pad 101 via a bonding pad 14 is thus transferred to two metal plugs 122b1 and 122b2. That is, each pad 101 is electrically connected to a solder ball 3c and a solder ball 3d via the two metal plugs 122b1 and 122b2, respectively. The plurality of solder balls 3 of different types (e.g. solder balls 3c and solder balls 3d) electrically connected to each pad 101 are electrically connected to each mounting board terminal 21 via solder paste 22.

In the third embodiment, as in the case of the second embodiment, the semiconductor package 1o includes two types of solder balls 3c and 3d which are different in material composition. When the semiconductor device 100 experiences a high level of thermal fatigue and a solder ball 3d is eventually broken, it is still possible to transmit and receive a signal to and from the printed wiring board 2 via a solder ball 3*c*. Similarly, when a large drop impact is experienced by the semiconductor device 100 and a solder ball 3*c* is broken, it is still possible to transmit and receive a signal to and from the printed wiring board 2 via a solder ball 3*d*. Furthermore, since two different types of solder balls 3 (3*c* and 3*d*) electrically connected to each pad 101 and are connected to the same mounting board terminal 21, it is possible to transfer more signals than in the case of the second embodiment.

The example embodiments described above deal with a case where a signal is output to the printed wiring board 2 from the semiconductor chip 10; the embodiments can also be applied to a case where a signal is input to the semiconductor chip 10 from the printed wiring board 2.

The embodiments mentioned above may be combined with one another to the extent possible. For example, the first embodiment can be combined with the third embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor package, comprising:
   a wiring substrate with a first surface and a second surface opposite the first surface;
   a plurality of bonding pads on the first surface of the wiring substrate;
   a semiconductor chip mounted on the first surface of the wiring substrate and having a plurality of pad terminals each electrically connected to one of the plurality of bonding pads;
   a wiring layer in the wiring substrate between the first surface and the second surface;
   a first conductive plug extending through the wiring substrate from the wiring layer to the first surface, the first conductive plug being connected to the respective bonding pad;
   a second conductive plug extending through the wiring substrate from the wiring layer to the second surface, the second conductive plug being electrically connected to the respective bonding pad;
   a third conductive plug extending through the wiring substrate from the wiring layer to the second surface, the third conductive plug being electrically connected to the respective bonding pad;
   a first solder ball on the second surface of the wiring substrate and electrically connected to the second conductive plug, the first solder ball being a first type; and
   a second solder ball on the second surface of the wiring substrate and electrically connected to the third conductive plug, the second solder ball being a second type different from the first type, wherein
   the second conductive plug and the third conductive plug are part of a first plug group of electrically connected plugs,
   the second conductive plug and the third conductive plug are separated from each other by at least one conductive plug of another plug group, and one of the second conductive plug or the third conductive plug is connected to an outermost one of the solder balls on the second surface.

2. The semiconductor package according to claim 1, wherein the first and second solder balls have the same composition.

3. The semiconductor package according to claim 2, further comprising:
   a spacer element on the second surface between each of the second solder balls and the third conductive plugs.

4. The semiconductor package according to claim 3, wherein the spacer element comprises an annular-shaped insulating resin structure and a metal plug inside the annular-shaped insulating resin structure.

5. The semiconductor package according to claim 1, further comprising:
   a spacer element on the second surface between each of the second solder balls and the third conductive plugs.

6. The semiconductor package according to claim 1, wherein the first and second solder balls have different lengths along a direction orthogonal to the second surface.

7. The semiconductor package according to claim 1, wherein the first and second solder balls have the different compositions.

8. The semiconductor package according to claim 1, wherein a silver content of the second solder balls is lower than a silver content of the first solder balls.

9. The semiconductor package according to claim 1, wherein a copper content of the first solder balls is higher than a copper content of the second solder balls.

10. The semiconductor package according to claim 1, wherein
    the first solder balls are an alloy containing bismuth, and
    the second solder balls do not contain bismuth.

11. The semiconductor package according to claim 1, further comprising:
    a resin covering the first surface of the wiring substrate, the plurality of bonding pads, and the semiconductor chip.

12. The semiconductor package according to claim 1, further comprising:
    a printed circuit board having a mounting surface with board terminals thereon.

13. The semiconductor package according to claim 12, wherein the first and second solder balls are connected to different board terminals on the printed circuit board.

14. The semiconductor package according to claim 12, wherein the first and second solder balls are connected to the same board terminal on the printed circuit board.

15. A semiconductor device, comprising:
    a wiring substrate with a first surface and a second surface opposite the first surface;
    a plurality of bonding pads on the first surface of the wiring substrate;
    a semiconductor chip mounted on the first surface and having a pad terminal electrically connected to a bonding pad in the plurality of bonding pads;
    a wiring layer in the wiring substrate between the first surface and the second surface;
    a first conductive plug extending through the wiring substrate from the wiring layer to the first surface, the first conductive plug being connected to the bonding pad;
    a second conductive plug extending through the wiring substrate from the wiring layer to the second surface, the second conductive plug being electrically connected to the bonding pad;

a third conductive plug extending through the wiring substrate from the wiring layer to the second surface, the third conductive plug being electrically connected to the bonding pad;

a first solder ball on the second surface of the wiring substrate and electrically connected to the second conductive plug, the first solder ball being a first type; and a second solder ball on the second surface of the wiring substrate and electrically connected to the third conductive plug, the second solder ball being a second type different from the first type, wherein the first solder ball and the second solder ball are electrically connected to the same bonding pad via the wiring layer, the first type solder ball having a thermal resistance fatigue resistance different from the second type solder ball, and the second type solder ball having a drop impact resistance different from the first type solder ball.

16. The semiconductor device according to claim 15, wherein the first and second solder balls have different compositions.

17. The semiconductor device according to claim 15, further comprising:

a spacer element on the second surface between each of the second solder balls and the third conductive plugs, wherein the first and second solder balls have different lengths along a direction orthogonal to the second surface.

18. The semiconductor device according to claim 15, wherein the first and second solder balls are connected to a different board terminal on a printed circuit board.

19. The semiconductor device according to claim 15, wherein the first and second solder balls are connected to a same board terminal on a printed circuit board.

20. A semiconductor package, comprising:

a wiring substrate with a first surface and a second surface opposite the first surface;

a plurality of connecting pads on the first surface of the wiring substrate;

a semiconductor chip mounted on the first surface of the wiring substrate and having a plurality of pad terminals each electrically connected to one of the plurality of connecting pads;

a wiring layer in the wiring substrate between the first surface and the second surface;

a first conductive plug extending through the wiring substrate from the wiring layer to the first surface, the first conductive plug being connected to one of the connecting pads;

a second conductive plug extending through the wiring substrate from the wiring layer to the second surface, the second conductive plug being electrically connected to the first conductive plug;

a third conductive plug extending through the wiring substrate from the wiring layer to the second surface, the third conductive plug being electrically connected to the first conductive plug;

a plurality of solder balls arrayed on the second surface of the wiring substrate including a first solder ball at an outermost array position and a second solder ball at an inner array position, wherein the second and third conductive plugs are connected to non-adjacent solder balls.

21. The semiconductor package according to claim 20, wherein the second conductive plug is connected to the first solder ball, the third conductive plug is connected to the second solder ball, and the distance between the first solder ball and the second solder ball is greater than twice the minimum distance of between adjacent solder balls in the plurality of solder balls.

22. The semiconductor package according to claim 20, wherein the second conductive plug is connected to the first solder ball, the third conductive plug is connected to the second solder ball, and the distance between the first solder ball and the second solder ball is greater than three times the minimum distance between adjacent solder balls in the plurality of solder balls.

* * * * *